United States Patent
Okuuchi et al.

(10) Patent No.: US 7,632,357 B2
(45) Date of Patent: Dec. 15, 2009

(54) SILICON WAFER CLEANING METHOD

(75) Inventors: Shigeru Okuuchi, Tokyo (JP); Mitsuhiro Endou, Tokyo (JP); Tomoya Tanaka, Tokyo (JP)

(73) Assignee: Sumco Corporation, Tokyo (JP)

( * ) Notice: Subject to any disclaimer, the term of this patent is extended or adjusted under 35 U.S.C. 154(b) by 532 days.

(21) Appl. No.: 11/499,142

(22) Filed: Aug. 4, 2006

(65) Prior Publication Data

US 2007/0034229 A1 Feb. 15, 2007

(30) Foreign Application Priority Data

Aug. 10, 2005 (JP) ............... P2005-231430

(51) Int. Cl.
*B08B 3/12* (2006.01)
*B08B 6/00* (2006.01)

(52) U.S. Cl. ............................. 134/1; 134/1.3

(58) Field of Classification Search ............... None
See application file for complete search history.

(56) References Cited

U.S. PATENT DOCUMENTS

| | | | | |
|---|---|---|---|---|
| 5,783,790 | A * | 7/1998 | Mitsumori et al. | 204/157.15 |
| 6,245,155 | B1 | 6/2001 | Leon et al. | |
| 2002/0121287 | A1 * | 9/2002 | Gilton | 134/1.3 |
| 2006/0054181 | A1 * | 3/2006 | Rayandayan et al. | 134/1 |
| 2008/0011321 | A1 * | 1/2008 | Ikemoto et al. | 134/1.3 |

FOREIGN PATENT DOCUMENTS

| | | |
|---|---|---|
| JP | 2000-91291 A | 3/2000 |
| KR | 0396955 | 11/2003 |
| WO | WO0113418 A1 | 2/2001 |

OTHER PUBLICATIONS

Y. Liu et al., "Study on the cleaning of silicon after CMP in ULSI," Microelectronic Engineering, 66: pp. 433-437 (2003).

European Search Report from corresponding European patent application No. EP 06016243, mailed on Jul. 21, 2008.

Shimura, F., *Silicon Crystal Growth and Wafer Preparation*, Japan 1993, pp. 125-127.

Chinese Office Action issued Aug. 17, 2007 in connection with counterpart Chinese Patent Application No. 200610159241.6.

* cited by examiner

*Primary Examiner*—Duy-Vu N Deo
(74) *Attorney, Agent, or Firm*—Kolisch Hartwell, P.C.

(57) ABSTRACT

A silicon wafer cleaning method, comprising a first cleaning process, in which, after completion of mirror polishing of the surface, the silicon wafer is immersed in a non-ionic surfactant aqueous solution; a second cleaning process, in which the wafer, after completion of the first cleaning process, is immersed in a dissolved-ozone aqueous solution; and, a third cleaning process, in which the wafer, after completion of the second cleaning process, is immersed in an aqueous solution containing ammonia and hydrogen peroxide; and in which the processes are performed in succession.

3 Claims, 2 Drawing Sheets

SILICON WAFER CLEANING METHOD

BACKGROUND OF THE INVENTION

1. Field of the Invention

The present invention relates to a silicon wafer cleaning method.

Priority is claimed on Japanese Patent Application No. 2005-231430, filed Aug. 10, 2005, the content of which is incorporated herein by reference.

2. Description of the Related Art

In mirror-polishing of silicon wafers, the surface of a silicon wafer mounted on a holding jig is pressed with prescribed pressure against a polishing cloth fixed onto a turntable, and by rotating the turntable while supplying a polishing slurry between the polishing cloth and the wafer surface, the wafer surface is polished to a mirror finish. As the polishing slurry, normally a liquid prepared by suspending fine $SiO_2$ particles or other abrasive particles in a weak alkaline liquid is used; cellulose or other polymer components may be further added to reduce haze and LPD, or to maintain wettability.

After mirror-polishing, a silicon wafer is cleaned in order to remove particles, organic contaminants, metallic impurities and other contaminants which may exist on the surface. In general, the RCA method is used to clean silicon wafers after mirror polishing has been completed (see for example Non-Patent Reference 1: Fumio Shimura, Handoutai Shirikon Kesshougaku, Maruzen, Sep. 30, 1993, pp. 125-127). The RCA method comprises two-stage cleaning using (1) a high-pH alkaline liquid mixture (hereafter "SC-1") based on hydrogen peroxide, and (2) a low-pH acidic liquid mixture (hereafter "SC-2"). By combining these liquid mixtures to perform cleaning, contaminants can be efficiently removed from the substrate surface.

However, polymer components contained in the polishing slurry used in mirror polishing remain on the surface of a silicon wafer after the completion of mirror polishing, and when using the RCA cleaning described in the above Non-Patent Reference 1, the polymer component contained in the polishing slurry undergoes a dehydration condensation or other reaction due to the SC-1 liquid mixture, to form derivatives of the polymer component; because this derivative is fixed on the wafer surface, the derivative fixed on the wafer surface is not removed even when SC-2 cleaning is performed following SC-1 cleaning, and so the cleanliness of the wafer surface cannot be improved sufficiently.

SUMMARY OF THE INVENTION

An object of this invention is the provision of a silicon wafer cleaning method with excellent cleaning performance.

This invention is an improvement on a cleaning method which is performed after mirror-polishing the surface of a silicon wafer, as shown in FIG. 1. The invention is characterized in comprising a first cleaning process, in which, after completion of the mirror polishing, the silicon wafer is immersed in a non-ionic surfactant aqueous solution; a second cleaning process, in which the wafer, after completion of the first cleaning process, is immersed in a dissolved-ozone aqueous solution; and, a third cleaning process, in which the wafer, after completion of the second cleaning process, is immersed in an aqueous solution containing ammonia and hydrogen peroxide; and is characterized in that the processes are performed in succession.

In the above cleaning method, by performing in succession the first cleaning process through the third cleaning process, in this order, for a silicon wafer for which mirror polishing has been completed, in the first cleaning process polymer components contained in the polishing slurry used in the mirror polishing and remaining on the wafer surface, and organic contaminants existing on the wafer surface, are removed; in the second cleaning process, the surfactant used in the first cleaning process, as well as organic contaminants which could not be completely removed in the first cleaning process, are decomposed and removed; and in the third cleaning process, organic contaminants and metallic impurities are removed, so that a wafer with a high degree of cleanliness can be obtained.

The above cleaning method may be a cleaning method in which the surfactant concentration in the non-ionic surfactant aqueous solution used in the first cleaning process is between 0.001 and 10 weight percent.

The above cleaning method may be a cleaning method in which the ozone concentration in the dissolved-ozone aqueous solution used in the second cleaning process is between 1 and 200 ppm.

In a silicon wafer cleaning method of this invention, by performing in succession the first cleaning process through the third cleaning process, in this order, for a silicon wafer for which mirror polishing has been completed, in the first cleaning process polymer components contained in the polishing slurry used in the mirror polishing and remaining on the wafer surface, and organic contaminants existing on the wafer surface, are removed; in the second cleaning process, the surfactant used in the first cleaning process, as well as organic contaminants which could not be completely removed in the first cleaning process, are decomposed and removed; and in the third cleaning process, organic contaminants and metallic impurities are removed, so that a wafer with a high degree of cleanliness can be obtained.

DETAILED DESCRIPTION OF THE INVENTION

Next, preferred aspects for implementation of the invention are explained based on the drawings.

The object of a cleaning method of this invention is a silicon wafer after the surface has been mirror-polished. On the surface of this silicon wafer subjected to mirror-polishing there remain not only organic contaminants, metallic impurities, and other contaminants, but also components contained in the polishing slurry used in the mirror polishing process.

Figure 1:
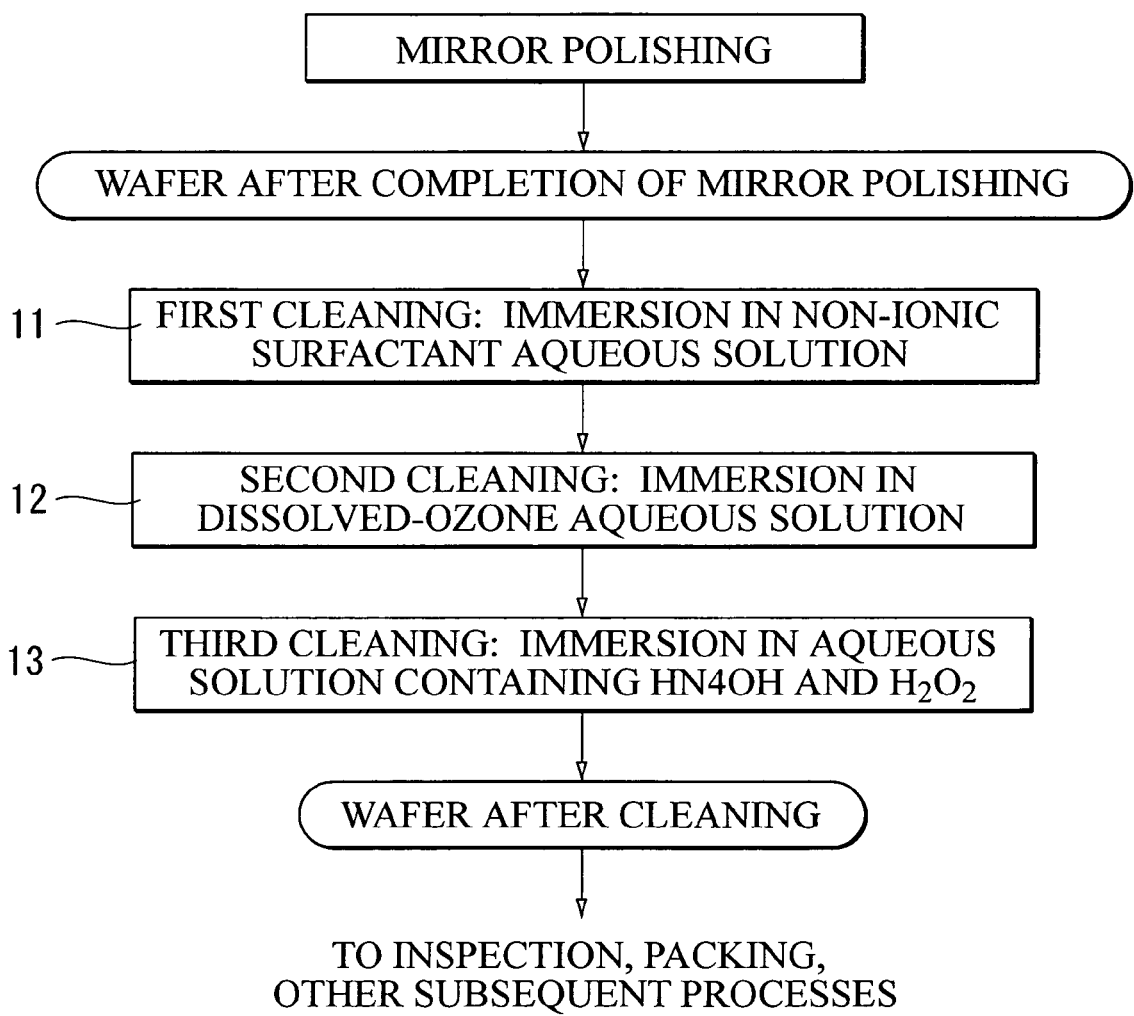
FIG. 1 shows cleaning processes of this invention, performed on a silicon wafer for which mirror polishing has been completed; and, FIG. 2 indicates the number of particles detected on a wafer after completion of cleaning, in Embodiment 1 and in Comparison Example 1.

In the silicon wafer cleaning method of this invention, the first cleaning process 11 through the third cleaning process 13 are performed in succession, as shown in FIG. 1.

First, in the first cleaning process 11, a silicon wafer which has been mirror-polished is immersed in a non-ionic surfactant aqueous solution. By this means, the advantageous result of cleaning and removal of polymer components and organic contaminants remaining on the wafer surface is obtained. In this first cleaning process 11, a non-ionic surfactant aqueous solution, obtained by dissolving a non-ionic surfactant, which does not cause reactions on the wafer surface, in ultrapure water, is used. If an anionic surfactant or cationic surfactant or similar, other than a non-ionic surfactant, is used in the aqueous solution employed in this first cleaning process 11, then there are cases in which reactions occur between the silicon and the surfactant, and there are problems in which the wafer surface is roughened. The surfactant concentration in the non-ionic surfactant aqueous solution used in the first cleaning process 11 is from 0.001 to 10 weight percent, and preferably from 0.1 to 3.0 weight percent, and more preferably 0.2 weight percent. If the surfactant concentration is less than 0.001 weight percent, organic contaminants remaining on the wafer surface cannot be adequately removed; if the surfactant concentration exceeds 10 weight percent, a large amount of the surfactant adheres to the wafer surface, and there is difficulty in removing all of the adhering surfactant in the subsequent process.

The non-ionic surfactant aqueous solution of the first cleaning process 11 is maintained in the temperature range from room temperature to 95° C. In the above temperature range, by heating the non-ionic surfactant aqueous solution to a temperature of 80 to 95° C. and performing cleaning, the effect of cleaning and removing organic contaminants remaining on the wafer surface is enhanced, and so is advantageous. The time of immersion of the silicon wafer in the non-ionic surfactant aqueous solution is from 1 to 10 minutes, and preferably from 2 to 5 minutes. If the immersion time is less than 1 minute, cleaning and removal of organic contaminants cannot be said to be sufficient, whereas even if 10 minutes is exceeded the cleaning effect is unchanged, and efficiency is poor.

Examples of types of non-ionic surfactant which is dissolved in the non-ionic surfactant aqueous solution include sorbitan monolaurate, sorbitan sesqui-isostearate and other sorbitan fatty acid esters; glycerine monooleate, glycerine monoisostearate and other glycerine fatty acid esters; diglyceryl monooleate, decaglyceryl di-isostearate and other polyglyceryl fatty acid esters; polyoxyethylene sorbitan monooleate and other polyoxyethylene sorbitan fatty acid esters; polyoxyethylene sorbitol monolaurate, polyoxyethylene sorbitol tetraoleate, and other polyoxyethylene sorbitol fatty acid esters; polyoxyethylene glyceryl monooleate and other polyoxyethylene glyceryl fatty acid esters; polyoxyethylene monoisostearate and other polyethylene glycol fatty acid esters; polyoxyethylene di-isostearate and other polyoxyglycol fatty acid esters; polyoxyethylene oleyl ether and other polyoxyethylene alkyl ethers; polyoxyethylene-1-polyoxypropylene-4-alkyl ether and other polyoxyethylene polyoxypropylene alkyl ethers; and polyoxyethylene castor oil, polyoxyethylene hydrogenated castor wax (40 E.O.), and other polyoxyethylene castor oils and hydrogenated castor waxes.

Next, in the second cleaning process 12, the wafer, having completed the above-described first cleaning process 11, is immersed in a dissolved-ozone aqueous solution. By this means, the effect of dissolving and removing surfactant used in the first cleaning process 11, and organic contaminants not completely removed in the first cleaning process 11, is obtained. In addition, Cu, Ni, and other metallic impurities existing on the wafer surface are oxidized, and so can be easily removed in the following third cleaning process 13. The ozone concentration in the dissolved-ozone aqueous solution is from 1 to 20 ppm, and preferably from 5 to 20 ppm. If the ozone concentration is less than 1 ppm, the advantageous results of the second cleaning process 12 are not obtained. The upper limit of 20 ppm is set in view of selection of the cleaning device and other members.

The dissolved-ozone aqueous solution in the second cleaning process 12 is used at a temperature approximately equal to room temperature. Or, a dissolved-ozone aqueous solution cooled to approximately 15° C., or a dissolved-ozone aqueous solution heated to approximately 50° C., may be used. Because it is easy to increase the ozone concentration in a dissolved-ozone aqueous solution which has been cooled, such a solution is used when ultrapure water of high purity, in which it is exceptionally difficult to raise the ozone concentration in aqueous solution, is employed as the solvent. The oxidizing power of dissolved-ozone aqueous solution which has been heated is greater than that at room temperature, and so is used when for example there is a need to increase the oxidizing power without changing the ozone concentration.

The time of immersion of the silicon wafer in the dissolved-ozone aqueous solution is from 1 to 10 minutes, and preferably from 2 to 5 minutes. If the immersion time is less than 1 minute, cleaning and removal of organic contaminants cannot be said to be sufficient, whereas even if 10 minutes is exceeded the cleaning effect is uncharged, and efficiency is poor.

Next, in the third cleaning process 13, the wafer, having completed the above-described second cleaning process 12, is immersed in an aqueous solution containing ammonia and hydrogen peroxide. By this means, the effect of removing particles remaining on the wafer surface is obtained. Organic contaminants can be removed by means of the strong oxidizing power of hydrogen peroxide solution and the decomposing action of ammonia. Moreover, Au, Ag, Cu, Ni, Cd, Zn, Co, Cr, and other group 1B, group 2B, and other metallic impurities are removed through compound-generating reactions with ammonia. As the aqueous solution containing ammonia and hydrogen peroxide used in the third cleaning process 13, an Sc-1 liquid mixture used in RCA cleaning may be employed. The aqueous solution containing ammonia and hydrogen peroxide used in the third cleaning process 13 is heated to a temperature of 75 to 80° C. and used. The time of immersion of the silicon wafer in the aqueous solution containing ammonia and hydrogen peroxide is from 1 to 20 minutes, and preferable from 2 to 5 minutes. If the immersion time is less than 1 minute, cleaning and removal of particle components cannot be said to be sufficient, whereas even if 20 minutes is exceeded the cleaning effect is unchanged and efficiency is poor, and moreover roughening of the wafer surface may result.

By thus performing the first cleaning process 11 through the third cleaning process in succession, in this order, particles, organic contaminants, and metallic impurities remaining on the surface of a silicon wafer for which mirror polishing has been completed can be removed.

If, between each of the processes from the first cleaning process 11 through the third cleaning process, rinsing is performed using pure water, then the cleaning effect of the following cleaning process cannot be fully realized due to the occurrence of non-ionic surfactant itself remaining on the wafer surface, and due to the occurrence of unevenness in the oxide film, formed by the dissolved-ozone aqueous solution, which results from introduction of OH bases; hence the first cleaning process 11 through the third cleaning process 13 must be performed in succession.

If the order of the first cleaning process 11 through the third cleaning process 13 in the cleaning method of this invention is interchanged, with for example cleaning performed in the order of the third cleaning process 13, then the first cleaning process 11, and then the second cleaning process 12, then polymer components contained in the polishing slurry undergo dehydration condensation or other reactions due to the aqueous solution containing ammonia and hydrogen peroxide in the third cleaning process, so that derivatives of the polymer components are formed, and these derivatives adhere to the wafer surface, so that even when the first cleaning process and second cleaning process are performed after the third cleaning process, the derivatives cannot be removed, and the cleaning effect of the cleaning method of this invention is no longer obtained. Further, if the first cleaning process 11 and second cleaning process 12 are interchanged, so that cleaning is performed in the order of the second cleaning process 12 and then the first cleaning process 11, the surfactant used in the first cleaning process 11 remains on the wafer surface, so that even if the third cleaning process 13 is subsequently performed, adequate removal is not possible, and the cleaning effect of the cleaning method of this invention is not obtained. Hence in the cleaning method of this invention, each of the first cleaning process 11 through the third cleaning process 13 must be performed in succession, in this order.

Further, in the cleaning method of this invention, cleaning by immersion of the wafer into a low-pH acid liquid mixture may be further performed following the third cleaning process 13. As the low-pH acid liquid mixture used here, a liquid mixture of hydrochloric acid and hydrogen peroxide may be used. By means of a liquid mixture of hydrochloric acid and hydrogen peroxide, alkaline ions and $Al^{3+}$, $Fe^{2+}$, $Mg^{2+}$, and other cations, which are insoluble in the aqueous solution containing ammonia and hydrogen peroxide used in the above third cleaning process, can be removed.

Embodiment 1

Next, an embodiment of the invention is explained in detail, together with a comparison example.

Embodiment 1

The following cleaning was performed continuously on 1,320,000 silicon wafers manufactured at a rate of 30,000/month during the period from June 2001 to January 2005, and for which mirror polishing had been completed.

First, as the non-ionic surfactant aqueous solution, a non-ionic surfactant (model NCW, manufactured by Wako Pure Chemical Industries, Ltd.) was dissolved in ultrapure water, to prepare an aqueous solution with a concentration of 0.2 weight percent, and a silicon wafer was immersed in the non-ionic surfactant aqueous solution heated to 90° C. and held for 3 minutes. Next, a dissolved-ozone aqueous solution with ozone concentration 20 ppm was prepared, and the silicon wafer was immersed in the dissolved-ozone aqueous solution, held at room temperature, and held for 3 minutes. Next, the silicon wafer was immersed and held for 3 minutes in an aqueous solution containing ammonia and hydrogen peroxide, prepared by dissolving 1.2 weight percent ammonia and 2.6 weight percent hydrogen peroxide in an aqueous solution heated to 80° C. After cleaning, the wafer was rinsed in pure water, and was then dried.

Comparison Example 1

The following cleaning was performed continuously on 180,000 silicon wafers, manufactured under conditions similar to those of Embodiment 1 at a rate of 30,000/month in the period from December 2000 to May 2001 and for which mirror polishing had been completed.

An aqueous solution was prepared in which 1.2 weight percent ammonia and 2.6 weight percent hydrogen peroxide were dissolved, and a silicon wafer was immersed and held for 3 minutes in the aqueous solution containing ammonia and hydrogen peroxide, heated to 80° C. After cleaning, the wafer was rinsed with pure water and then dried.

Comparison Experiment 1

A particle counter (model CR80, manufactured by ADE) was used to measure the wafer surface over a fixed arbitrary range for silicon wafers which had been subjected to the cleaning of Embodiment 1 and the cleaning of Comparison Example 1, and particles exceeding 0.12 μm in size were detected. The numbers of particles detected from wafers subjected to the cleaning of Embodiment 1 and Comparison Example 1 appear in FIG. 2; average values, maximum values, and minimum values for the numbers of particles detected from wafers subjected to the cleaning of Embodiment 1 and Comparison Example 1 are shown in Table 1.

TABLE 1

| | Number of particles detected exceeding 0.12 μm | | |
|---|---|---|---|
| | Average value | Maximum | Minimum |
| Embodiment 1 | 3.61 | 5.8 | 2.3 |
| Comparison Example 1 | 11.9 | 13.2 | 10.2 |

Figure 2:
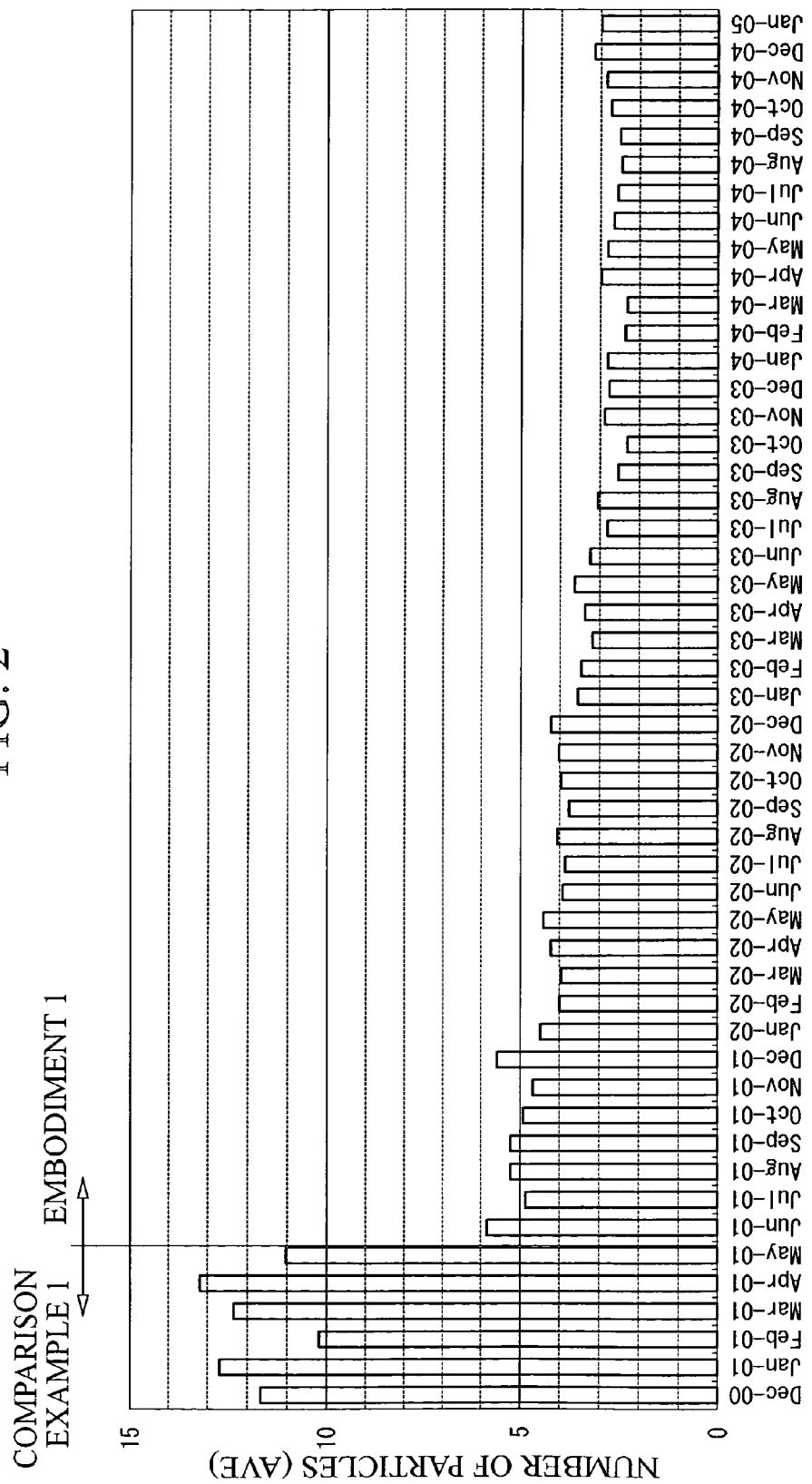

As is clear from FIG. 2 and Table 1, compared with wafers subjected to the cleaning of Comparison Example 1, the number of particles exceeding 0.12 μm detected on the wafers subjected to the cleaning of Embodiment 1 is much smaller, and so it is seen that the cleanliness of wafers can be improved by means of the cleaning method of this invention.

The cleaning method of this invention can be applied not only to silicon wafers which have been mirror-polished, but to cleaning of glass substrates for use in liquid crystal displays and similar.

In the above, a preferred embodiment of the invention was explained; but this invention is not limited to the embodiment. Various additions, omissions, replacements, and other alterations can be made, without deviating from the gist of the invention. The invention is not limited by the above explanation, but is limited only by the scope of the attached claims.

What is claimed is:

1. A silicon wafer cleaning method, performed after mirror-polishing of the surface of the silicon wafer, comprising:
a first cleaning process, in which, after completion of said mirror polishing, the silicon wafer is immersed in a non-ionic surfactant aqueous solution;
a second cleaning process, in which the silicon wafer, after completion of said first cleaning process, is immersed in a dissolved-ozone aqueous solution; and,
a third cleaning process, in which the silicon wafer, after completion of said second cleaning process, is immersed in an aqueous solution containing ammonia and hydrogen peroxide;
wherein said first cleaning process through third cleaning process are performed in succession;
the aqueous solution containing ammonia and hydrogen peroxide used in the third cleaning process is heated to a temperature of 75 to 80° C. and used; and
the time of immersion of the silicon wafer in the aqueous solution containing ammonia and hydrogen peroxide is from 2 to 5 minutes.

2. The cleaning method according to claim 1, wherein the surfactant concentration in the non-ionic surfactant aqueous solution used in said first cleaning process is from 0.001 to 10 weight percent.

3. The cleaning method according to claim 1, wherein the ozone concentration in the dissolved-ozone aqueous solution used in said second cleaning process is from 1 to 20 ppm.

* * * * *